(12) United States Patent
Zhao et al.

(10) Patent No.: US 11,081,666 B2
(45) Date of Patent: Aug. 3, 2021

(54) FILM MATERIAL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Erjin Zhao, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 17 days.

(21) Appl. No.: 16/562,767

(22) Filed: Sep. 6, 2019

(65) Prior Publication Data
US 2020/0243796 A1  Jul. 30, 2020

(30) Foreign Application Priority Data
Jan. 30, 2019  (CN) .......................... 201920170987.X

(51) Int. Cl.
| H01L 51/52 | (2006.01) |
| B32B 38/18 | (2006.01) |
| B32B 38/00 | (2006.01) |
| B32B 37/12 | (2006.01) |
| B32B 7/12 | (2006.01) |
| B32B 3/02 | (2006.01) |
| B32B 3/30 | (2006.01) |

(52) U.S. Cl.
CPC ............ *H01L 51/5246* (2013.01); *B32B 3/02* (2013.01); *B32B 3/30* (2013.01); *B32B 7/12* (2013.01); *B32B 37/1292* (2013.01); *B32B 38/105* (2013.01); *B32B 38/1808* (2013.01); *H01L 51/5253* (2013.01)

(58) Field of Classification Search
CPC ... H01L 51/5246; H01L 51/5253; B32B 7/12; B32B 3/02; B32B 3/30; B32B 38/1808; B32B 38/105; B32B 37/1292
See application file for complete search history.

(56) References Cited

U.S. PATENT DOCUMENTS

| 2012/0055622 A1* | 3/2012 | Kitagawa ............ B32B 38/1808 156/229 |
| 2014/0009697 A1* | 1/2014 | Kuromizu ............ G02B 6/0088 348/790 |
| 2018/0370186 A1* | 12/2018 | Everaerts .................. B32B 7/14 |

* cited by examiner

*Primary Examiner* — Syed I Gheyas
(74) *Attorney, Agent, or Firm* — Brooks Kushman P.C.

(57) ABSTRACT

The present disclosure provides a film material and a display device, and relates to the field of display technology. The film material includes a base material and a functional film layer arranged on the base material, in which the base material includes an active region and an auxiliary region surrounding the active region, the functional film layer covering the active region, and not completely covering the auxiliary region. The film material provided by the present disclosure is applied into a display device.

19 Claims, 11 Drawing Sheets

FILM MATERIAL AND DISPLAY DEVICE

CROSS-REFERENCE TO RELATED APPLICATION

This application claims priority to Chinese Patent Application No. 201920170987.X filed on Jan. 30, 2019, which is incorporated herein by reference in its entirety.

TECHNICAL FIELD

The present disclosure relates to the field of display technology, in particular, to a film material and a display device.

BACKGROUND

With the continuous development of display technology, the quality requirements for the film materials in the display field are getting higher and higher. Taking an underlying protective film as an example, the underlying protective film is generally a multi-layered structure, including a protective layer, a base material, and a release layer that are laminated sequentially. In actual application, the underlying protective film can be attached to the display device to protect the display device.

Although the film material of the multi-layer structure has relatively high quality and good performance, each film layer in the film material is attached to the base material through an adhesive layer. Thus, in the process of the production, storage and application for the film material, when the film material is collided by an external force, a phenomenon of film layer separation is likely to occur at an edge position of the film material. The film layer separation often causes problems such as the warpage of the film layer, the entering of impurities, and the generation of bubbles, thereby affecting the yield of the film material.

SUMMARY

The present disclosure provides the following technical solutions.

A first aspect of the present disclosure provides a film material including a base material and a functional film layer arranged on the base material, in which the base material and the functional film layer both include an active region and an auxiliary region surrounding the active region, the functional film layer covers the active region of the base material, an orthogonal projection of the active region of the functional film layer on the base material coincides with the active region of the base material, and the functional film layer does not completely cover the auxiliary region of the base material.

The orthogonal projection of the functional film layer on the base material is located within the base material and has an area less than an area of the base material.

Optionally, the functional film layer includes: a release layer attached to a first surface of the base material by a first adhesive layer; and/or a protective layer attached to a second surface of the base material by a second adhesive layer, and the second surface being opposite to the first surface.

Optionally, an orthogonal projection of the first adhesive layer on the base material coincides with an orthogonal projection of the release layer on the base material; and/or, an orthogonal projection of the second adhesive layer on the base material coincides with an orthogonal projection of the protective layer on the base material.

Optionally, the film material is provided with at least one notch portion at an edge position of the auxiliary region.

Optionally, a shape of an orthogonal projection of the notch portion on a plane parallel to the base material includes one or more selected from a rectangle, a triangle, and two long strips respectively located on two opposite sides of the auxiliary region.

Optionally, the first adhesive layer includes a plurality of first block patterns independent of each other.

Optionally, the plurality of first block patterns is evenly distributed on the film material.

Optionally, a total area of the plurality of block patterns of the first adhesive layer is greater than 50% of S and less than S, and the S is an area of the base material of the temporary protective film.

Optionally, the second adhesive layer includes a plurality of second block patterns independent of each other.

Optionally, the plurality of second block patterns is evenly distributed on the film material.

Optionally, the first adhesive layer includes a plurality of first block patterns independent of each other, and the second adhesive layer includes a plurality of second block patterns independent of each other; the plurality of second block patterns is staggered with the plurality of first block patterns of the first adhesive layer in a direction perpendicular to the base material, or the plurality of second block patterns is configured to be in one-to-one correspondence to the plurality of first block patterns of the first adhesive layer in a direction perpendicular to the base material, and an orthogonal projection of each of the plurality of first block patterns on the base material partially coincides or coincides with an orthogonal projection of the second block patterns in one-to-one correspondence on the base material.

Optionally, the plurality of first block patterns is evenly distributed.

A second aspect of the present disclosure provides a display device including the film material as described above and a display substrate.

BRIEF DESCRIPTION OF THE DRAWINGS

The drawings described herein are intended to provide a further understanding of the present disclosure, and constitute a part of this disclosure. The illustrative embodiments of the present disclosure and the description thereof are intended to illustrate the present disclosure, and do not constitute an improper limitation of the present disclosure.

DETAILED DESCRIPTION

In order to further illustrate the film material and the display device provided by the embodiments of the present disclosure, the present disclosure will be described in detail hereinafter in conjunction with the drawings.

An object of the present disclosure is to provide a film material and a display device for solving the problems in the related art that the film materials prone to the warpage of the film layer, the entering of the impurities, and the generation of the bubbles, thereby affecting the yield of the film material.

As described in the background, the film materials commonly used in the display technology in the related art, such as a polarizer, a top protective film, and a bottom protective film, are all multi-layer composite structures. In the process of the production, storage and application for the film material, it is inevitable that it will be collided by an external force, so that the phenomenon of film layer separation of one or more layers is likely to occur at the edge position of the film material. The film layer separation often causes the warpage of the film layer, the entering of the impurities, and the generation of the bubbles, thereby affecting the normal bonding process of the film material.

Figure 1:
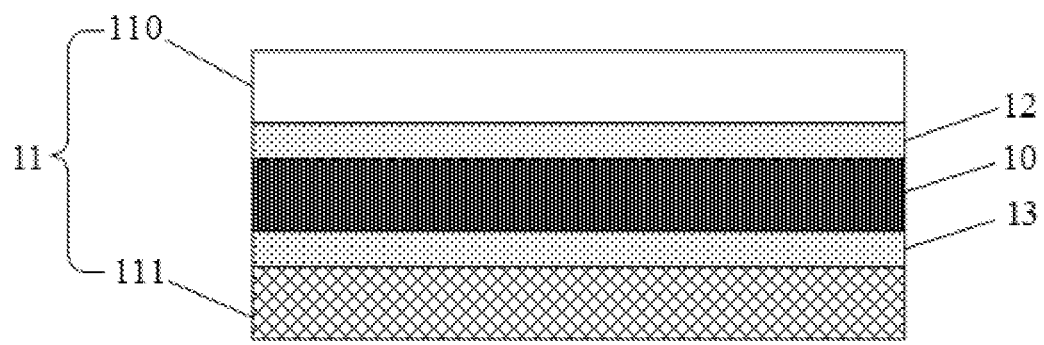
FIG. 1 is a schematic cross-sectional view showing a film material in the related art.
Figure 2:
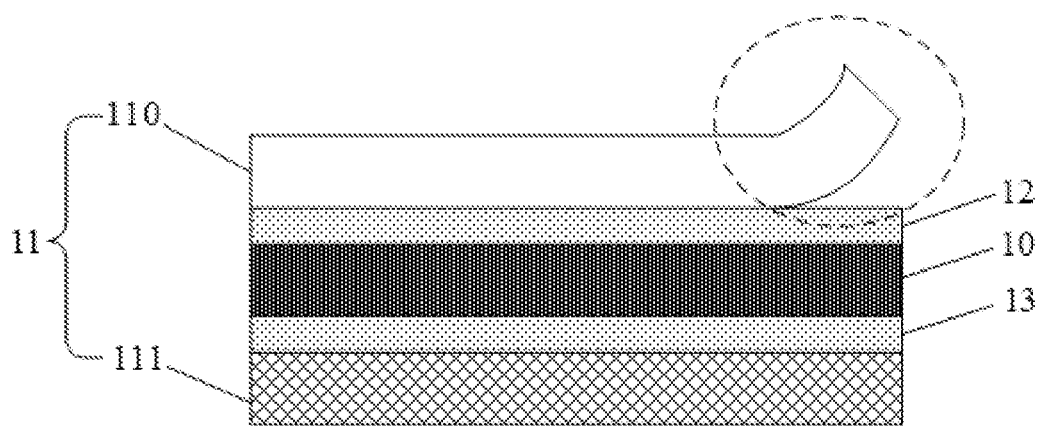
FIG. 2 is a schematic cross-sectional view showing a separation of a functional film layer from a base material in a film material in the related art.
Figure 3:
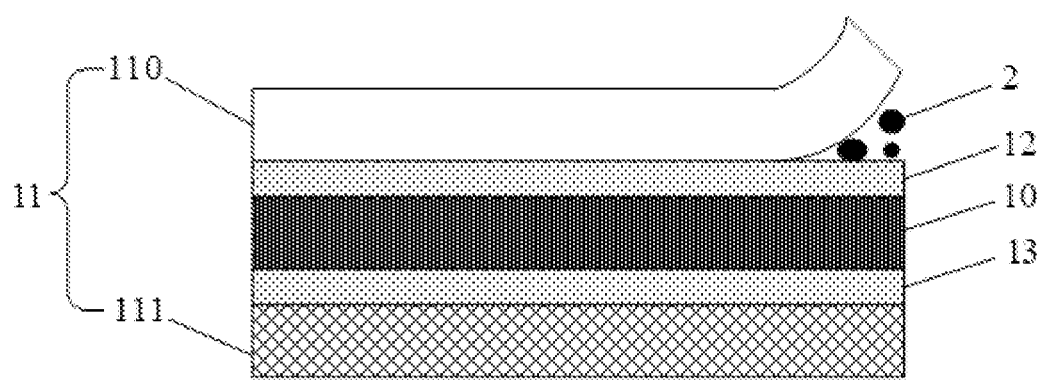
FIG. 3 is a schematic view showing the impurities entering a gap between a functional film layer and a base material after a separation of the functional film layer from the base material in a film material in the related art.
Figure 4:
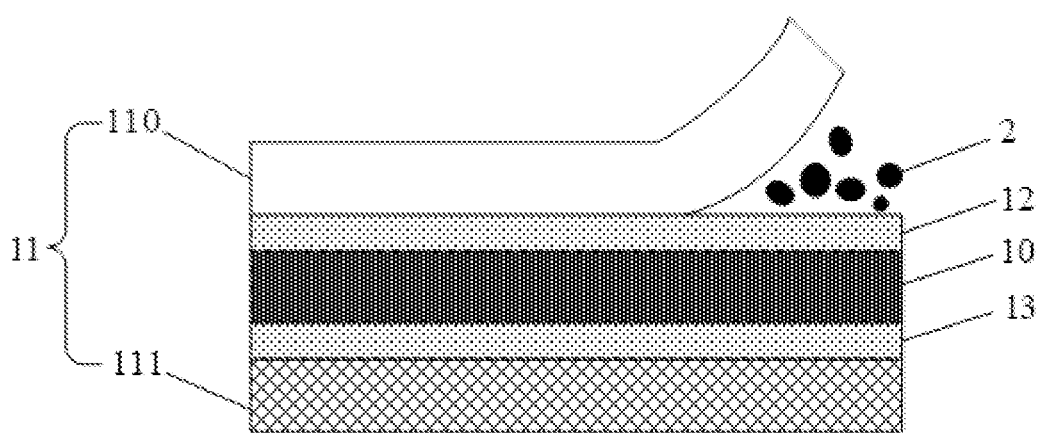
FIG. 4 is a schematic view showing a large-area separation of a functional film layer from a base material in a film material in the related art.

Taking the underlying protective film as an example, as shown in FIG. 1, the underlying protective film includes: a base material 10, a first adhesive layer 12 and a second adhesive layer 13 respectively arranged on the upper and lower surfaces of the base material 10, and a release layer 110 attached to the first adhesive layer 12, and a protective layer 111 attached to the second adhesive layer 13. When the underlying protective film is collided, as shown in FIG. 2, the separation of the release layer 110 from the first adhesive layer 12 are likely to occur at the edge position of the underlying protective film, thereby causing the first adhesive layer 12 to be exposed to the external environment. As shown in FIG. 3, the exposed first adhesive layer 12 easily adheres to the particulate impurities 2, and the impurities 2 adhered to the first adhesive layer 12 may cause the contamination to the base material 10, and may even scratch the base material 10, which seriously affects the subsequent attaching process of the underlying protective film. Moreover, as shown in FIG. 4, when the problems of film layer separation continue to develop toward the center portion of the underlying protective film, such problem of film layer separation will seriously affect the normal use of the underlying protective film.

Figure 5:
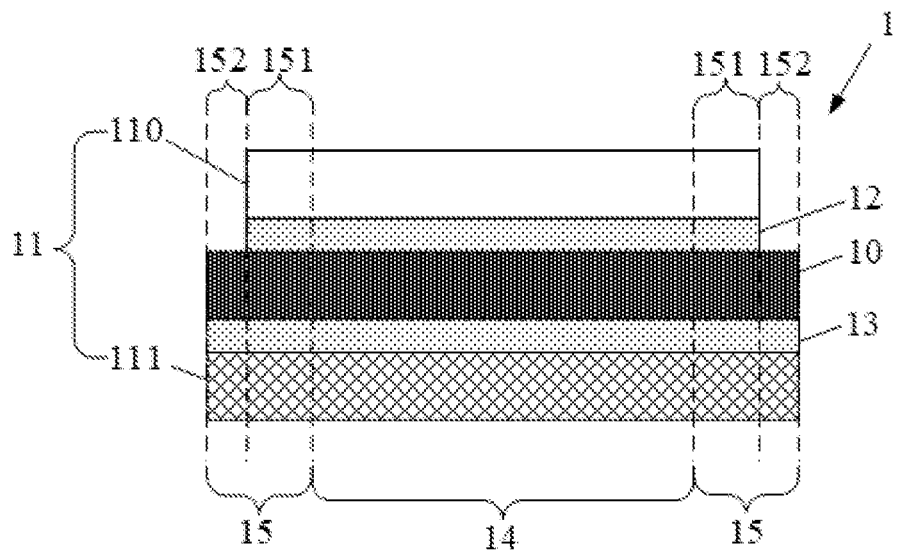
FIG. 5 is a first cross-sectional view of a film material according to an embodiment of the present disclosure.
Figure 6:
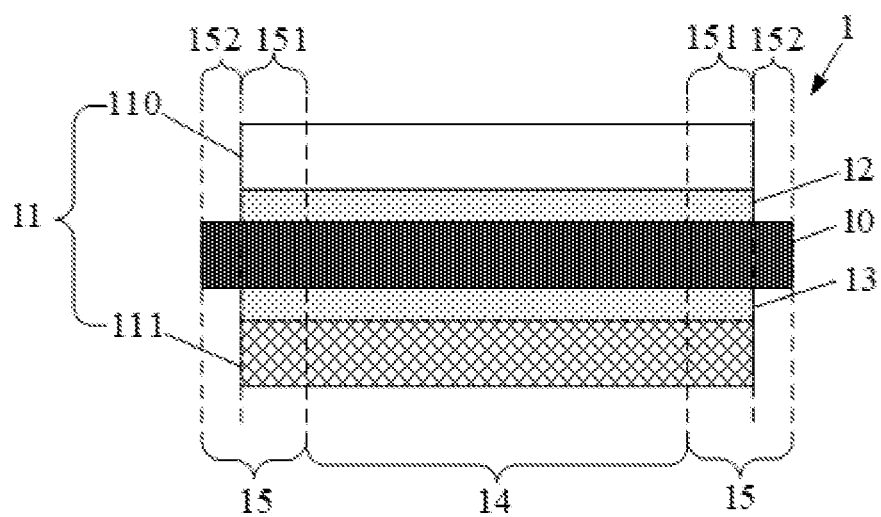
FIG. 6 is a second cross-sectional view of a film material according to an embodiment of the present disclosure.

Based on the existence of the above problems, referring to FIG. 5 and FIG. 6, an embodiment of the present disclosure provides a film material 1, including a base material 10 and a functional film layer 11 arranged on the base material 10. The base material 10 and the functional film layers 11 both include an active region 14 and an auxiliary region 15 surrounding the active region 14. The functional film layer 11 covers the active region 14 of the base material, an orthogonal projection of the active region 14 of the functional film layer 11 on the base material coincides with the active regions 14 of the base material, and the functional film layer 11 does not completely cover the auxiliary region 15 of the base material.

Specifically, the film layer 1 generally involves a problem of alignment in practical applications. Therefore, when the film material 1 is produced, an auxiliary region 15 is provided around the active region 14 of the film material 1, the base material 10 playing a key functional role in the corresponding film material 1 has an active region 14 and an auxiliary region 15, and the active region 14 plays a major role in the film material 1. Therefore, the size of the functional film layer 11 in the auxiliary region 15 in the film material 1 is reduced, and the exposure of the base material 10 located in the auxiliary region 15 does not affect the normal use of the film material 1. Illustratively, when the film material 1 is applied to the display device, the active region 14 in the film material 1 corresponds to the effective display region in the display device, and the auxiliary region 15 in the film material 1 corresponds to the non-active display region surrounding the effective display region in the display device.

According to the specific structure of the above film material 1, the film material 1 provided by the embodiment of the present disclosure covers the active region 14 by providing the functional film layer 11 and does not completely cover the auxiliary region 15, so that the functional film layer 11 is not aligned with the base material 10 at the edge of the film material 1 in a direction perpendicular to the base material 10. Thus, in the process of the production, storage and application for the film material 1, when the film material 1 is collided by an external force, the phenomenon of film layer separation is likely to occur at the edge position of the film material 1, thereby well avoiding the defects such as the warpage of the film layer, the entering of the impurities, and the generation of the bubbles. Therefore, the film material 1 provided by the embodiment of the present disclosure can ensure a high yield in the process of production, storage and application, and can ensure the adhesion yield of the film material 1 in the attaching process.

In some embodiments, the functional film layer 11 may be arranged to cover a portion of the auxiliary region 15, and an orthogonal projection of the functional film layer 11 on the base material 10 is located within the base material 10 and has an area less than an area of the base material 10.

In some embodiments, as shown in FIG. 5, on one side of the base material 10, the functional film layer 11 can completely cover the active region 14 and the first sub-region 151 in the auxiliary region 15 proximate to the active region 14, and the portion of the base material 10 at the second sub-region 152 located at the periphery of the first sub-region 151 is exposed on the side. On the other side of the base material 10, the functional film layer 11 can completely cover the active region 14 and the auxiliary region 15, and an orthographic projection of the functional film layer 11 on the base material 10 falls within the base material 10. That is, the edge of the base material 10 is not aligned with the edge of the functional film layer 11 located on the side of the base material 10 in a direction perpendicular to the base material 10, and the edge of the base material 10 protrudes beyond the functional film layer 11. The edge of the base material 10 is aligned with the edge of the functional film layer 11 located on the other side of the base material 10 in a direction perpendicular to the base material 10.

In some embodiments, as shown in FIG. 6, on both sides of the base material 10, the functional film layer 11 can completely cover the active region 14 and the first sub-region 151 in the auxiliary region 15 proximate to the active region 14, and the portion of the base material 10 at the second sub-region 152 located at the periphery of the first sub-region 151 is exposed on both sides. That is, the edge of the base material 10 is not aligned with the edge of the functional film layer 11 located on both sides of the base material 10 in a direction perpendicular to the base material 10, and the edge of the base material 10 protrudes beyond the functional film layer 11.

According to the above arrangement, it is better to ensure that, during the process of the production, storage and application for the film material 1, once the film material 1 is collided by an external force, it is not likely to occur a phenomenon of film layer separation at the edge position of the film material 1, thereby avoiding the defects such as the warpage of the film layer, the entering of the impurities, and the generation of the bubbles.

Further, the functional film layer 11 provided by the above embodiment may include: a release layer 110 attached to a first surface of the base material 10 by a first adhesive layer 12; and/or a protective layer 111 attached to a second surface of the base material 10 by a second adhesive layer 13, and the second surface being opposite to the first surface.

Specifically, depending on the kind of the film layer, the specific type of the above functional film layer 11 may be different. When the functional film layer 11 includes a release layer 110 attached to a first surface of the base material 10 by a first adhesive layer 12; and/or when the second adhesive layer 13 is attached to the protective layer 111 of the second surface of the base material 10, the first adhesive layer 12 may be arranged, and the release layer 110, the second adhesive layer 13 and the protective layer 111 all covers the active region 14, but fail to completely cover the auxiliary region 15. Further, the first adhesive layer 12 may be arranged, and the orthogonal projections of the release layer 110, the second adhesive layer 13 and the protective layer 111 on the base material 10 are located within the base material 10, and have areas less than the area of the base material 10.

Further, as shown in FIG. 6, the orthogonal projection of the first adhesive layer 12 on the base material 10 may coincide with the orthogonal projection of the release layer 110 on the base material 10; and/or the orthogonal projection of the second adhesive layer 13 on the material 10 may coincide with the orthogonal projection of the protective layer 111 on the base material 10.

Specifically, the orthogonal projection of the first adhesive layer 12 on the base material 10 may coincide with the orthogonal projection of the release layer 110 on the base material 10; and the orthogonal projection of the second adhesive layer 13 on the material 10 may coincide with the orthogonal projection of the protective layer 111 on the base material 10. Thus, not only the release layer 110 and the protective layer 111 can be firmly bonded to the base material 10, but also the first adhesive layer 12 and the second adhesive layer 13 are completely covered, and are not easy to adhere to the impurities, thereby better ensuring the yield of the film material 1.

Optionally, in the case that the first adhesive layer 12, the release layer 110, the second adhesive layer 13 and the protective layer 111 all cover the active region 14 and the orthogonal projections of the first adhesive layer 12, the release layer 110, the second adhesive layer 13 and the protective layer 111 on the base material 10 are all located within the base material 10 and have areas less than the area of the base material 10, the orthogonal projection of the first adhesive layer 12 on the base material 10 may coincide with the orthogonal projection of the release layer 110 on the base material 10; and the orthogonal projection of the second adhesive layer 13 on the material 10 may coincide with the orthogonal projection of the protective layer 111 on the base material 10.

Figure 9:
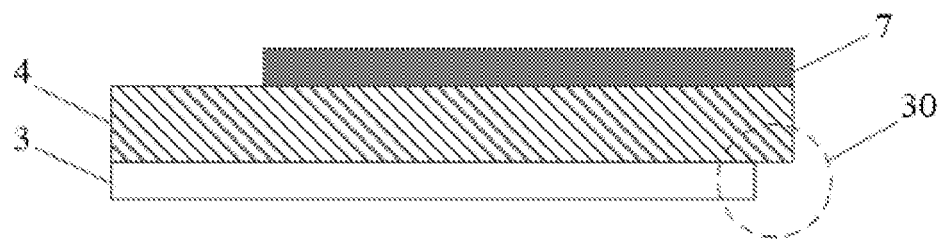
FIG. 9 is a schematic view showing a notch portion provided on a temporary protective film according to an embodiment of the present disclosure.
Figure 10:
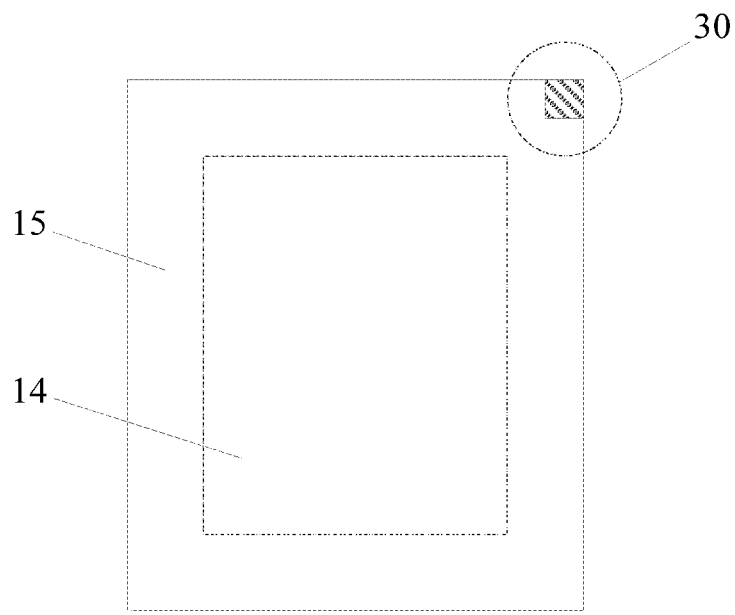
FIG. 10 is a first top plan view showing a notch portion according to an embodiment of the present disclosure.

As shown in FIGS. 9 and 10, the application of the film material 1 provided in the above embodiment is various. Illustratively, the film material 1 is used as the temporary protective film 3 provided on a bottom surface of the display substrate 4. The edge portion of the auxiliary region 15 of the temporary protective film 3 is provided with at least one notch portion 30, and at least one notch portion 30 exposes at least a portion of the edge of the bottom surface.

Figure 7:
FIG. 7 is a schematic view showing a display substrate with a protective film attached to upper and lower surfaces in the related art.
Figure 8:
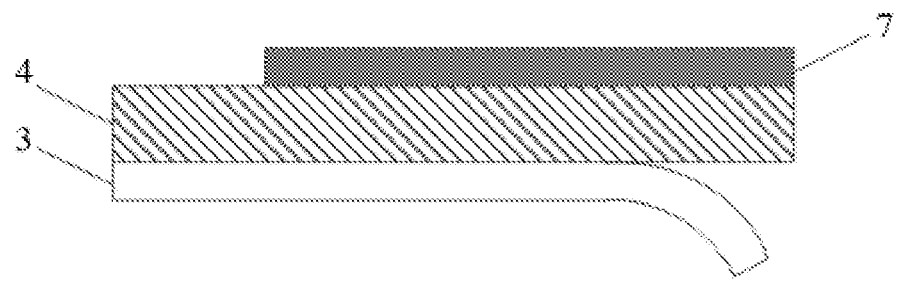
FIG. 8 is a schematic view showing a display substrate peeling off a temporary protective film in the related art.

Specifically, as shown in FIGS. 7 and 8, taking the OLED display device as an example, in order to temporarily protect the display substrate 4 for manufacturing the OLED display device, during the process for preparing the OLED display device, firstly the top protective film 7 needs to be attached to the upper surface of the display substrate 4, and the temporary protective film 3 as a bottom protective film is attached on the lower surface of the display substrate 4 (i.e., the surface of the bottom surface in the display substrate 4). Then, when the display substrate 4 needs to be bent, the temporary protective film 3 is peeled off and a permanent underlying protective film is attached. However, in the process of peeling off the temporary protective film 3, a phenomenon of dislocation peeling often occurs, for example, the OLED display substrate 4 and the top protective film 7 are peeled off, resulting in the failure of OLED display substrate 4.

The film material 1 provided by the embodiment of the present disclosure is used as the temporary protective film 3 provided on the bottom surface of the display substrate 4. The edge portion of the auxiliary region 15 of the temporary protective film 3 is provided with at least one notch portion 30, and at least one notch portion 30 exposes at least a portion of the edge of the bottom surface. Thus, when the temporary protective film 3 is peeled off, the notch portion 30 can be peeled off as a starting position, so that the peeling interface is more easily recognized. Moreover, when the notch portion 30 is used as the starting position, the force is applied to the position of the notch portion 30, and the action point of the force is moved toward the center of the display substrate 4 as compared with the peeling when the notch portion 30 is not provided. Therefore, when the film 1 provided by the embodiment of the present disclosure is used as the temporary protective film 3 arranged on the bottom surface of the display substrate 4, the accuracy of peeling off the temporary protective film 3 is better improved, the phenomenon of dislocation peeling is avoided, and the yield of the display substrate 4 is more effectively ensured.

It should be noted that since the notch portion 30 is provided in the auxiliary region 15, it does not affect the normal use and the function of the temporary protective film 3.

Figure 11:
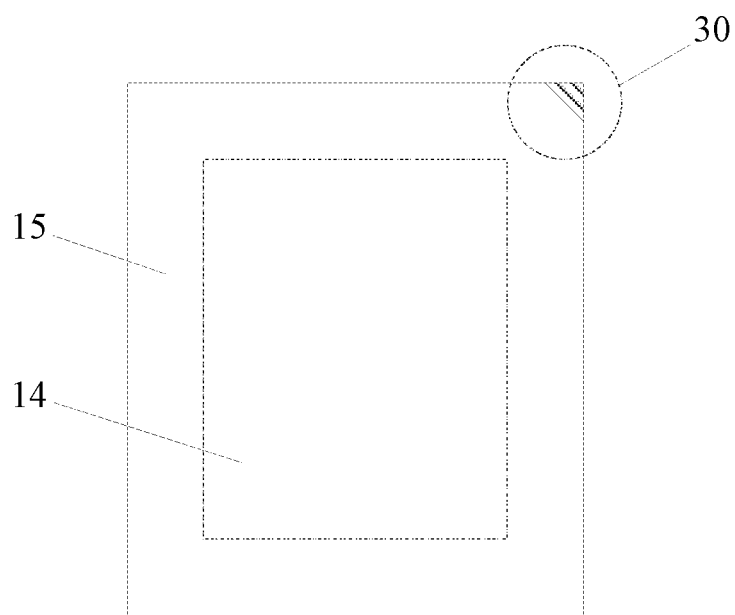
FIG. 11 is a second top plan view showing a notch portion according to an embodiment of the present disclosure.

The specific position of the notch portion 30 may be arranged according to actual requirements. In some embodiments, as shown in FIGS. 10 and 11, the orthogonal projection of the notch portion 30 on the bottom surface may be located at the boundary between two adjacent sides of the bottom surface.

Specifically, the orthogonal projection of the notch portion 30 on the bottom surface is located at a junction two adjacent sides of the bottom surface, that is, the notch portion 30 is arranged at an angled region of the temporary protective film 3. Thus, not only the position of the notch can be determined more conveniently, but also the temporary protective film 3 is peeled off from the angled region of the temporary protective film 3, thereby being more favorable for the smooth progress of the peeling operation.

Figure 12:
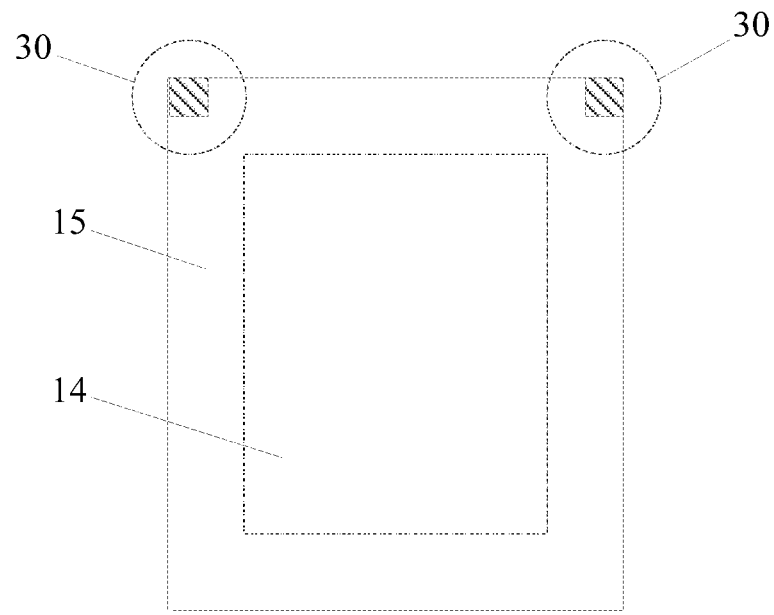
FIG. 12 is a third top plan view showing a notch portion according to an embodiment of the present disclosure.
Figure 13:
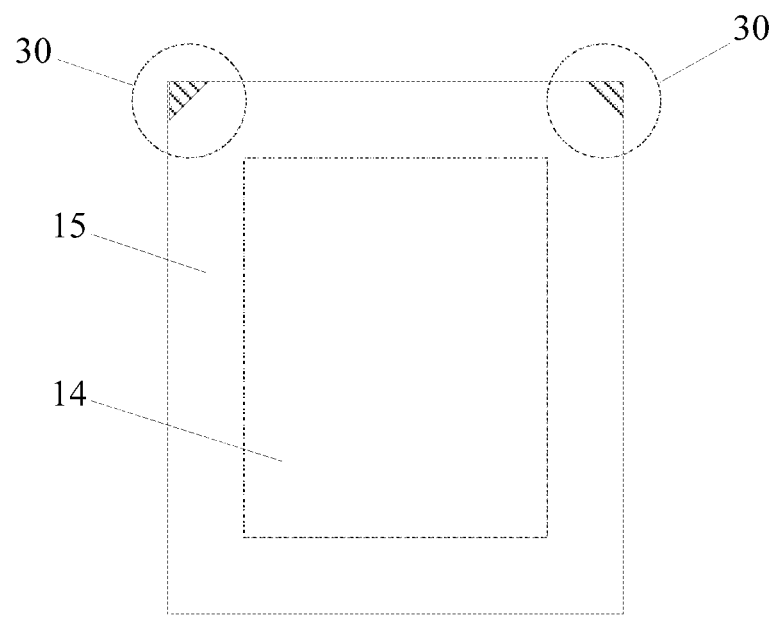
FIG. 13 is a fourth top plan view showing a notch portion according to an embodiment of the present disclosure.
Figure 14:
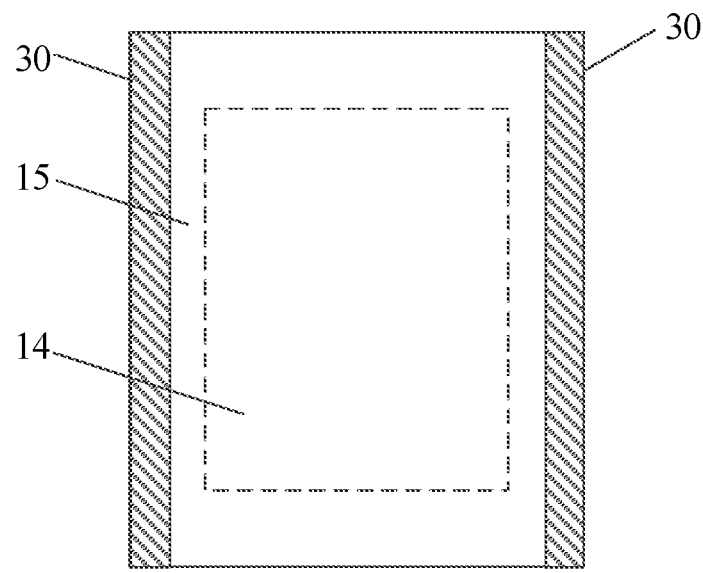
FIG. 14 is a fifth top plan view showing a notch portion according to an embodiment of the present disclosure.

Further, as shown in FIGS. 12, 13 and 14, two notch portions 30 may be arranged in the auxiliary region 15 of the temporary protective film 3, orthogonal projections of the two notch portions 30 on the bottom surface are in correspondence to two adjacent junctions in the bottom surface respectively, and both the two adjacent junctions are at the junctions of two adjacent sides of the bottom surface.

Specifically, the number and position of the notch portions 30 may be set according to actual requirements. Illustratively, two notch portions 30 may be arranged, and the two notch portions 30 may be arranged in adjacent two angled regions respectively.

The manner in which the two notches 30 are provided can achieve the peeling operation at the position of the two notch portions 30 at the same time, which is more favorable for improving the peeling efficiency.

Further, the shape of the notch portion 30 provided by the above embodiment is various. Illustratively, as shown in FIGS. 10 and 11, the shape of the orthogonal projection of the notch portion 30 on the bottom surface includes one or more of a rectangle, a triangle, and two long strips respectively located on two opposite sides of the auxiliary region 15.

Specifically, when the shape of the orthogonal projection of the notch portion 30 on the bottom surface is the rectangle, two sides perpendicular to each other in the rectangle may be arranged to coincide with the two sides of the bottom surface located in the angled region. When the shape of the orthogonal projection of the notch portion 30 on the bottom surface is a triangle, two sides perpendicular to each other in the triangle may be arranged to coincide with two sides of the bottom surface located at the angled region.

Figure 17:
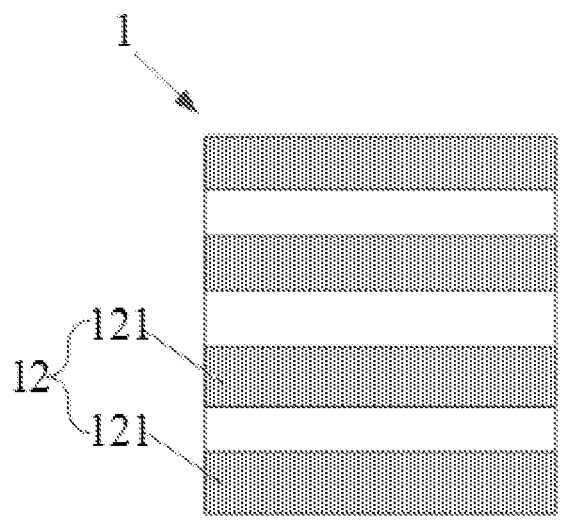
FIG. 17 is a first top plan view showing a first adhesive layer having a plurality of first block patterns according to an embodiment of the present disclosure.
Figure 18:
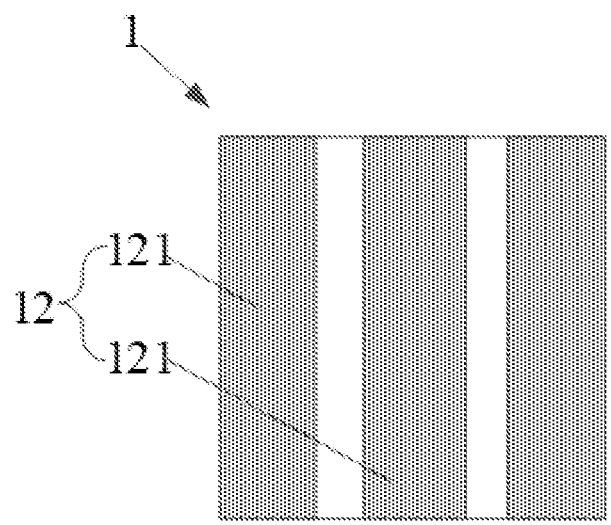
FIG. 18 is a second top plan view showing a first adhesive layer having a plurality of first block patterns according to an embodiment of the present disclosure.
Figure 19:
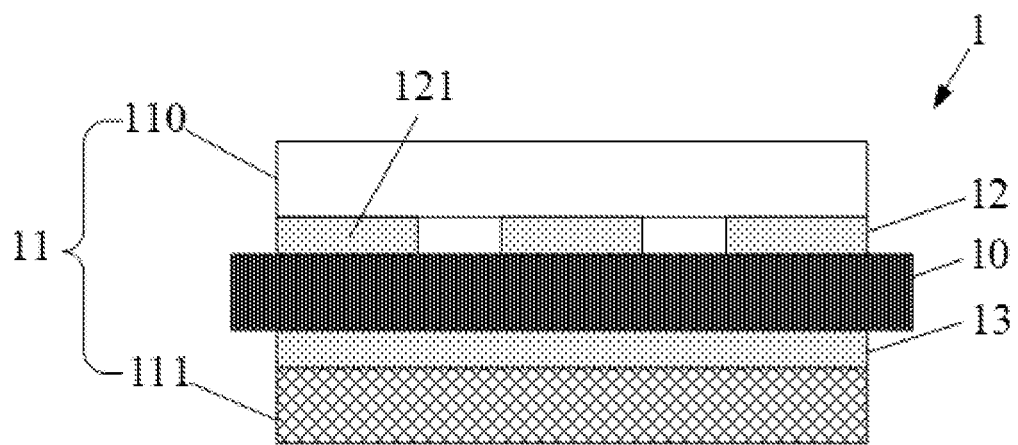
FIG. 19 is a cross-sectional view showing a film material including a first adhesive layer having a plurality of first block patterns according to an embodiment of the present disclosure.
Figure 20:
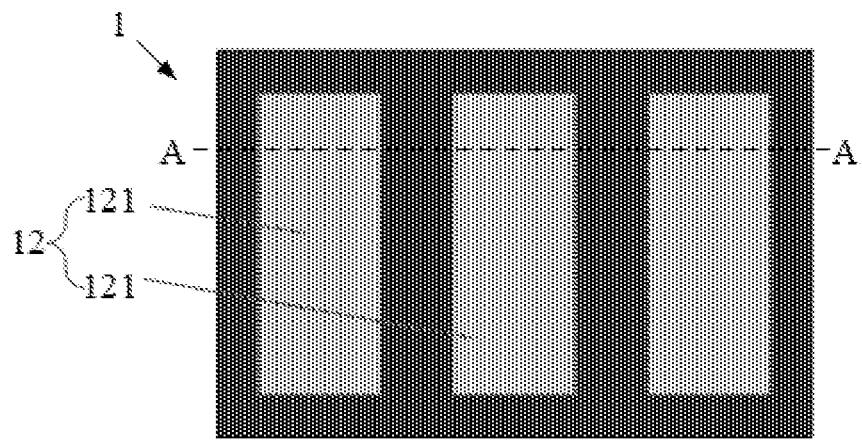
FIG. 20 is a top plan view showing a film material including a first adhesive layer having a plurality of first block patterns according to an embodiment of the present disclosure.
Figure 21:
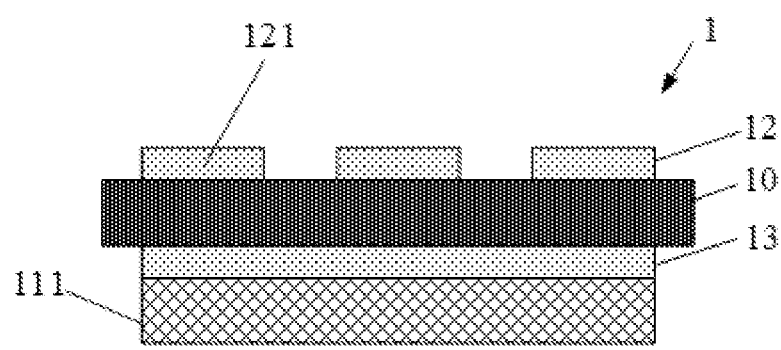
FIG. 21 is a schematic cross-sectional view showing a film material after peeling off a release layer according to an embodiment of the present disclosure.
Figure 22:
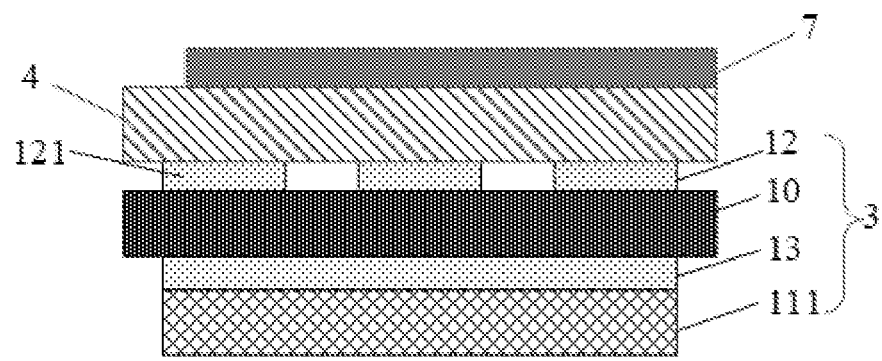
FIG. 22 is a schematic cross-sectional view showing a film material attached to a display substrate according to an embodiment of the present disclosure.

In some embodiments, as shown in FIGS. 17 to 22, in the film material 1 provided in the above embodiment, the first adhesive layer 12 includes a plurality of first block patterns 121 independent of each other. FIGS. 17 and 18 are top plan views showing the first adhesive layer 12 having the plurality of first block patterns 121, in which the plurality of first block patterns 121 may be arranged transversally, as shown in FIG. 17, or longitudinally, as shown in FIG. 18. FIG. 19 is a cross-sectional view showing the film material 1 including a first adhesive layer 12 having a plurality of first block patterns 121. FIG. 20 is a top view showing the film material 1 exposing the first adhesive layer 12 having a plurality of first block patterns 121 after peeling off the release layer 110. FIG. 21 is a schematic cross-sectional view showing the film material 1 of FIG. 20 taken along AA. FIG. 22 is a schematic view showing the temporary protective film 3 attached to the display substrate 4, in which the film material 1 as the temporary protective film 3 is attached to the bottom surface of the display substrate 4 by the first adhesive layer 12.

Specifically, the plurality of first block patterns 121 has an attaching function. After the release layer 110 is peeled off, a plurality of first block patterns 121 in the first adhesive layer 12 are attached to the display substrate 4 on the bottom surface, and thus the temporary protective film 3 is attached to the bottom surface of the display substrate 4 through the plurality of first block patterns 121 of the first adhesive layer 12. In this way, not only the temporary protective film 3 can be firmly attached to the display substrate 4 through the first adhesive layer 12 during the protection of the display substrate 4 by the temporary protective film 3, but also the temporary protective film 3 can be peeled off more efficiently when the temporary protective film 3 is peeled off, and at the same time, it is also more favorable for improving the peeling success rate of the temporary protective film 3.

Further, the total area of the plurality of first block patterns 121 of the first adhesive layer 12 provided by the above embodiment may be greater than 50% of S and less than S, and the S represents an area of the base material of the temporary protective film 3.

Specifically, the total area of the plurality of first block patterns 121 of the first adhesive layer 12 is set to be greater than 50% of S and less than S, so that not only the temporary protective film 3 can be firmly attached to the display substrate 4 through the first adhesive layer 12 during the protection of the display substrate 4 by the temporary protective film 3, but also the temporary protective film 3 can be peeled off more efficiently when the temporary protective film 3 is peeled off, and at the same time, it is also more favorable for improving the peeling success rate of the temporary protective film 3.

Further, the plurality of first block patterns 121 provided by the above embodiments may be uniformly distributed.

Specifically, the plurality of first block patterns 121 are evenly distributed, so that during the protection of the display substrate 4 by the temporary protective film 3, the temporary protective film 3 can be firmly attached to the display substrate 4 through the uniformly distributed plurality of first block patterns 50, thereby being more favorable for improving the protective effect of the temporary protective film 3 on the display substrate 4.

Figure 15:
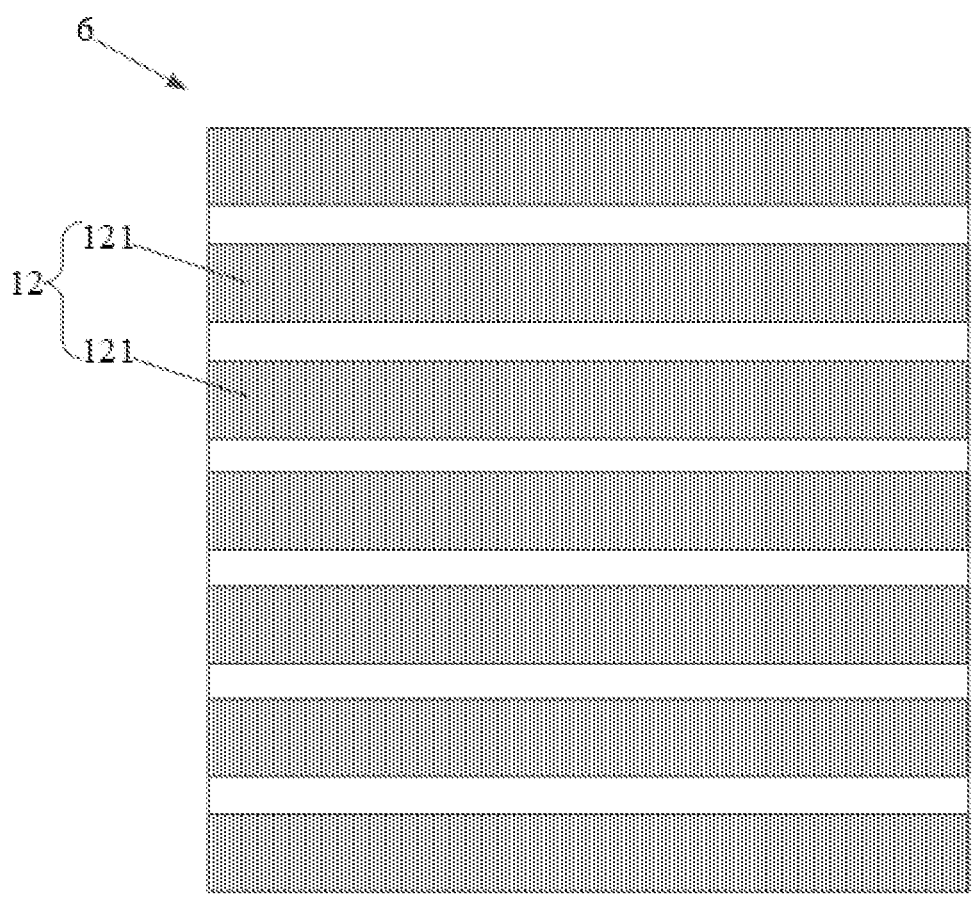
FIG. 15 is a first schematic view showing a mother board of a film material according to an embodiment of the present disclosure.
Figure 16:
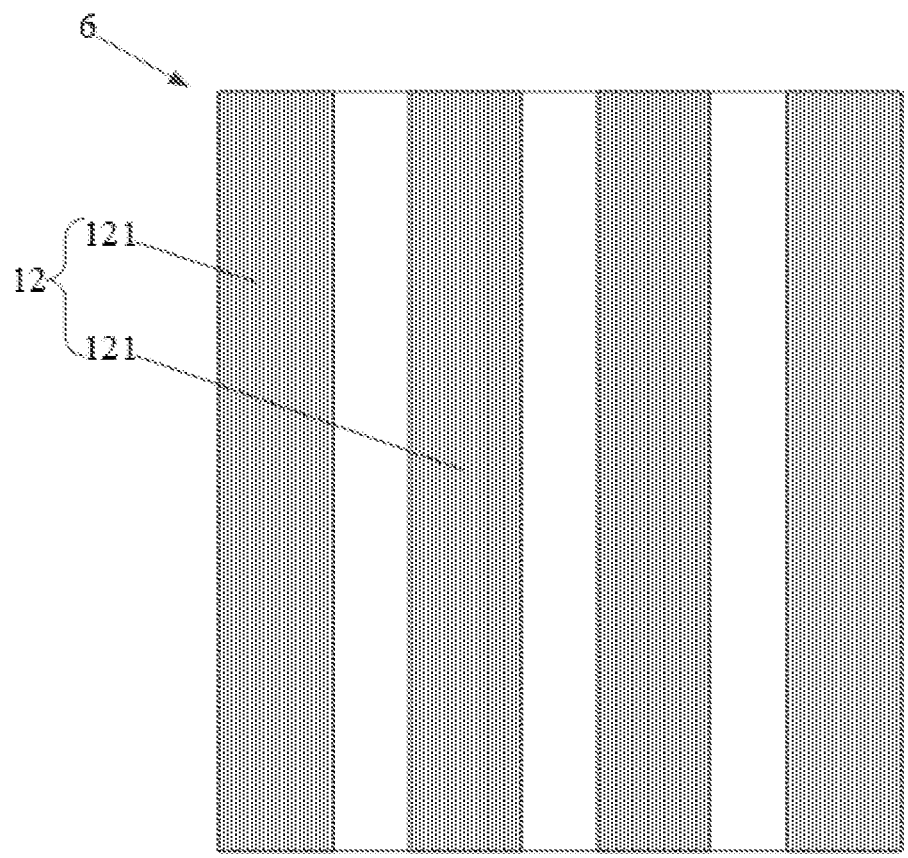
FIG. 16 is a second schematic view showing a mother board of a film material according to an embodiment of the present disclosure.

As shown in FIGS. 15 and 16, during an actual production, in order to improve production efficiency, firstly, a display mother board including a plurality of display substrates 4 and a film mother board 6 including a plurality of film materials 1 are generally produced, and the film mother board 6 is directly attached to the display mother board, and then the display mother board to which the film mother board 6 is attached is cut to obtain a plurality of mutually independent display substrates 4 to which the film material 1 is attached.

When the display substrate 4 to which the film material 1 is attached is formed in the above manner, it is necessary to ensure that the film material 1 attached to each of the display substrates 4 includes a plurality of first block patterns 121 independent of each other, so that not only the film layer can be ensured to be firmly attached during the protection of the display substrate 4 by the temporary protective film 3, but also the temporary protective film 3 can be peeled off more efficiently when the temporary protective film 3 is peeled off, and at the same time, it is also more favorable for improving the peeling success rate of the temporary protective film 3.

It should be noted that the shape of the first block pattern 121 included in the first adhesive layer 12 provided by the above embodiment may be set according to actual needs. Illustratively, the first block pattern 121 may be in a shape of long strip, and the long side of the block pattern 121 may be perpendicular to the long side of the film mother board 6, or may be parallel to the long side of the film mother board 6. Further, the shape of the block pattern 121 may be set to be a polygon, a circle, or the like.

Figure 23:
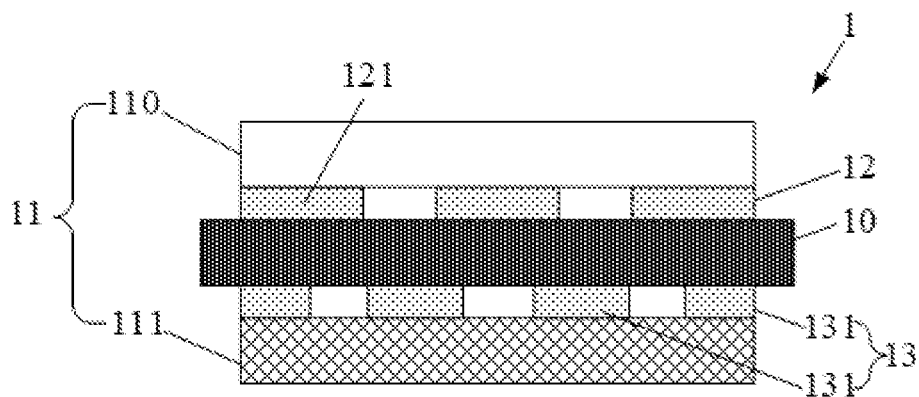
FIG. 23 is a schematic cross-sectional view showing a film material in which a plurality of first block patterns are staggered with a plurality of second block patterns according to an embodiment of the present disclosure.
Figure 24:
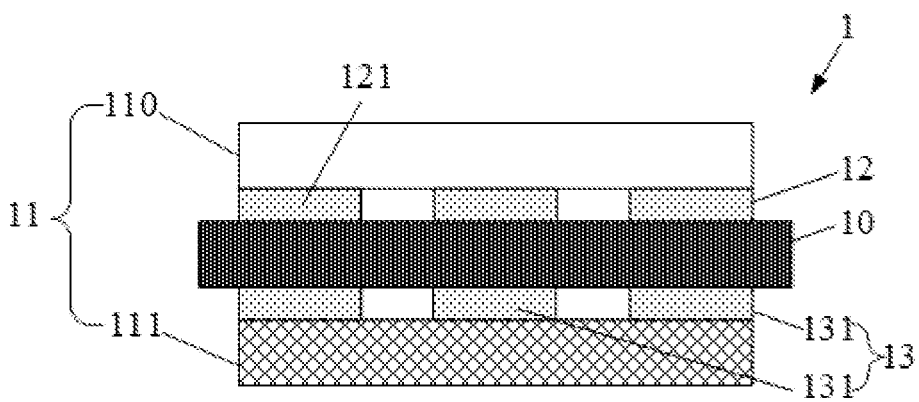
FIG. 24 is a schematic cross-sectional view showing a film material in which a plurality of first block patterns respectively corresponds to a plurality of second block patterns according to an embodiment of the present disclosure.

Optionally, as shown in FIGS. 23 and 24, the second adhesive layer 13 may also include a plurality of second block patterns 131, and the plurality of second block patterns 131 has the attaching function for attaching a protecting layer 111 to base material 10. The arrangement of the second block patterns 131 may be similar to the arrangement of the first block patterns 121. To avoid duplication, it is not further described herein. When the protective layer 111 is replaced, the protective layer 111 can be peeled off more efficiently, and at the same time, it is more favorable for improving the peeling success rate of the protective layer 111.

The plurality of second block pattern 131 may be staggered with the plurality of first block pattern 121 of the first adhesive layer 12 in a direction perpendicular to the base material 10, as shown in FIG. 23; or may be configured to be in one-to-one correspondence to the plurality of first block patterns 121 of the first adhesive layer 12 in a direction perpendicular to the base material 10. That is, in a direction perpendicular to the base material 10, an orthogonal projection of each of the plurality of first block patterns 10 on the base material at least partially coincides with an orthogonal projection of the second block patterns in one-to-one correspondence on the base material, as shown in FIG. 24. Optionally, the first adhesive layer 12 is a full-surface adhesive layer, and the second adhesive layer 13 includes a plurality of second block-shaped patterns 131; or, the first adhesive layer 12 includes a plurality of first block patterns 121, and the second adhesive layer 13 is a full-surface adhesive layer.

The embodiment of the present disclosure further provides a display device including the film material provided by the above embodiment, and a display substrate.

In the film material provided by the present disclosure, the functional film layer covers the active region 14 of the base material, and the orthogonal projection of the active region of the functional film layer on the base material coincides with the active region 14 of the base material; and the functional film layer does not completely cover the auxiliary region 15 of the base material, such that at the edge of the film material, the functional film layer is not aligned with the base material in a direction perpendicular to the base material. Thus, in the process of the production, storage and application for the film material provided by the above embodiment, when the film material is collided by an external force, the phenomenon of film layer separation is likely to occur at the edge position of the film material, thereby well avoiding the defects such as the warpage of the film layer, the entering of the impurities, and the generation of the bubbles, and thus ensuring that the film has a high yield. Therefore, the display device provided by the embodiment of the present disclosure also has a high yield when the film material is included.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or base material, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A film material, comprising:
   a base material and a functional film layer arranged on the base material which are independent from a display substrate,
   wherein the base material and the functional film layer both comprise an active region and an auxiliary region surrounding the active region, the functional film layer covers the active region of the base material, an orthogonal projection of the active region of the functional film layer on the base material coincides with the active region of the base material, and the functional film layer does not completely cover the auxiliary region of the base material; and an orthogonal projection of the functional film layer on the base material does not extend beyond the base material, at least one corner portion of the auxiliary region is provided with a notch portion.

2. The film material according to claim 1, wherein the orthogonal projection of the functional film layer on the base material is located within the base material and has an area less than an area of the base material, and in a direction perpendicular to the base material, an edge of the base material protrudes beyond the functional film layer.

3. The film material according to claim 1, wherein the functional film layer comprises:
a release layer, the release layer being attached to a first surface of the base material by a first adhesive layer; and/or
a protective layer, the protective layer being attached to a second surface of the base material by a second adhesive layer, and the second surface being opposite to the first surface.

4. The film material according to claim 3, wherein
an orthogonal projection of the first adhesive layer on the base material coincides with an orthogonal projection of the release layer on the base material; and/or,
an orthogonal projection of the second adhesive layer on the base material coincides with an orthogonal projection of the protective layer on the base material.

5. The film material according to claim 1, wherein a shape of an orthogonal projection of the notch portion on a plane parallel to the base material comprises one or more selected from a rectangle, and a triangle.

6. The film material according to claim 3, wherein the first adhesive layer comprises a plurality of first block patterns independent of each other.

7. The film material according to claim 6, wherein the plurality of first block patterns is evenly distributed on the film material.

8. The film material according to claim 6, wherein a total area of the plurality of first block patterns of the first adhesive layer is greater than 50% of S and less than S, and S is an area of the base material of the film material.

9. The film material according to claim 3, wherein the second adhesive layer comprises a plurality of second block patterns independent of each other.

10. The film material according to claim 9, wherein the plurality of second block patterns is evenly distributed on the film material.

11. The film material according to claim 3, wherein the first adhesive layer comprises a plurality of first block patterns independent of each other, and the second adhesive layer comprises a plurality of second block patterns independent of each other;
the plurality of second block patterns is staggered with the plurality of first block patterns of the first adhesive layer in a direction perpendicular to the base material, or
the plurality of second block patterns is configured to be in one-to-one correspondence to the plurality of first block patterns of the first adhesive layer in a direction perpendicular to the base material, and an orthogonal projection of each of the plurality of first block patterns on the base material partially coincides or coincides with an orthogonal projection of the second block patterns in one-to-one correspondence on the base material.

12. A display device comprising the film material according to claim 1 and a display substrate.

13. The display device according to claim 12, wherein the functional film layer comprises:
a first adhesive layer, the first adhesive layer being attached to a first surface of the base material; and/or
a protective layer, the protective layer being attached to a second surface of the base material by a second adhesive layer, and the second surface being opposite to the first surface.

14. The display device according to claim 13, wherein
an orthogonal projection of the second adhesive layer on the base material coincides with an orthogonal projection of the protective layer on the base material.

15. The display device according to claim 12, wherein when the film material is attached as a temporary protective film onto a bottom surface of the display substrate, and the notch portion exposes at least a portion of an edge of the bottom surface.

16. The display device according to claim 15, wherein an orthogonal projection of the notch portion on the bottom surface is located at a junction of two adjacent sides of the bottom surface.

17. The display device according to claim 16, wherein an auxiliary region of the temporary protective film is provided with two notch portions, the orthogonal projections of the two notch portions on the bottom surface are in correspondence to two adjacent junctions on the bottom surface respectively, and the two adjacent junctions are junctions of two adjacent sides of the bottom surface.

18. The display device according to claim 16, wherein a shape of an orthogonal projection of the notch portion on the bottom surface comprises one or more selected from a rectangle, a triangle, and two long strips respectively located on two opposite sides of the auxiliary region.

19. The display device according to claim 12, wherein a temporary protective film is attached to the bottom surface of the display substrate through the first adhesive layer, and the first adhesive layer comprises a plurality of first block patterns independent of each other.

* * * * *